United States Patent
Fukaya et al.

(10) Patent No.: US 7,851,756 B2
(45) Date of Patent: Dec. 14, 2010

(54) CHARGED PARTICLE BEAM IRRADIATION SYSTEM

(75) Inventors: Ritsuo Fukaya, Hitachinaka (JP); Zhigang Wang, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 183 days.

(21) Appl. No.: 12/182,709

(22) Filed: Jul. 30, 2008

(65) Prior Publication Data

US 2009/0032723 A1  Feb. 5, 2009

(30) Foreign Application Priority Data

Jul. 31, 2007  (JP) .............................. 2007-199933

(51) Int. Cl.
*G01K 1/08* (2006.01)
*H01J 3/14* (2006.01)
*H01J 3/26* (2006.01)

(52) U.S. Cl. .................. 250/310; 250/311; 250/307; 250/309; 250/396 R

(58) Field of Classification Search .................. 250/397, 250/311, 307, 309, 492.22, 396 R, 492.21; 850/9; 345/10–18, 20, 27, 29
See application file for complete search history.

(56) References Cited

U.S. PATENT DOCUMENTS 5,302,828 A * 4/1994 Monahan .................... 250/307

7,187,345 B2  3/2007 Kobaru et al.

FOREIGN PATENT DOCUMENTS

JP  2005-142038 A  6/2005

OTHER PUBLICATIONS

John C. Russ, Computer-Assisted Microscopy; Plenum Publishing Corp. New York 1990; pp. 40-41.
David Joy, "Charge Control During Photomask Critical Dimension (CD) Metrology", International Sematech, Technology Transfer #03114452B-ENG, Feb. 27, 2004, pp. 1-12.

* cited by examiner

*Primary Examiner*—Jack I Berman
*Assistant Examiner*—Meenakshi S Sahu
(74) *Attorney, Agent, or Firm*—Crowell & Moring LLP

(57) ABSTRACT

It is to prevent an image drift from occurring caused by a specimen being charged when observing the specimen including an insulating material.

A first scan is performed in a predetermined direction on scanning line and in a predetermined sequential direction of scanning lines and a second scan is performed in a scanning direction different from the predetermined scanning direction and in a sequential direction different from the predetermined sequential direction. An image may be created by repeating the process of executing the second scan after executing the first scan and by requiring the arithmetic average of the frames obtained by the second scans. An image may be created by averaging arithmetically at least one frame obtained by the first scan and at least one frame obtained by the second scan.

15 Claims, 4 Drawing Sheets

CHARGED PARTICLE BEAM IRRADIATION SYSTEM

BACKGROUND OF THE INVENTION

1. Field of the Invention

The invention relates to a charged particle beam irradiation system which irradiates a specimen with charged particles such as electron, and particularly to a charged particle beam irradiation system which analyzes the aspect on the surface of a specimen using a secondary discharged signal.

2. Description of the Related Art

In the semiconductor manufacturing industry, a scanning electron microscope (SEM), a CD-SEM for performing critical dimension scanning, and an inspection SEM for inspecting the pattern shape and the like are widely used as an inspection device of a semiconductor device.

In these days, a highly integrated semiconductor device has been developed rapidly in the semiconductor manufacturing industry. According to this, various kinds of electrically-insulating thin films are formed on a semiconductor device. When electron beam is irradiated on an insulating material, electric charges are accumulated through secondary electron discharge and a specimen becomes charged. When an electric field is produced by the charge of the specimen, the electron beam incident on the specimen is bent and the irradiation position of the electron beam is deflected.

The amount of electric charges on the specimen is determined by the amount of an incident electron beam, the physical property of an insulating material, the presence or absence of a path having diffusion on electric charges and its resistance, and the like.

In the electron beam scan, a scanning area usually rectangular is scanned sequentially from one end to the other. The accumulated electric charges within the scanning area are spatially asymmetrical. The electric charges are diffused through a conductive material existing within the scanning area and its vicinity. The accumulated electric charges are accompanied by a time fluctuation of a large time constant. According to the spatial asymmetry and the temporal fluctuation of the accumulated electric charges, the electric field spatially and temporally fluctuates. According to this, the irradiation position of the electron beam fluctuates spatially and temporally.

In the case of a scanning electron microscope, an image is shifted according to the charge of the specimen. Hereinafter, this phenomenon is referred to as "image drift". Generally, in the scanning electron microscope, the same area is scanned a plurality of times (each scan is referred to as "frame") and the obtained images are averaged, to improve the S/N ratio. Therefore when the positions of the images are deflected from each other in the respective frames, the image obtained as the averaging result deteriorates remarkably in resolution. A charged particle beam irradiation system which irradiates a charged particle beam also has the same problem.

Patent Document 1: Japanese Patent Application Laid-Open (JP-A) No. 2005-142038, Non-Patent Document 1: "Charge Control During Photomask Critical Dimension (CD) Metrology" written by David Joy, International SEMATEC Technology Transfer #3114452B-ENG (2004), Non-Patent Document 2: John C. Russ: Computer-Assisted Microscopy; Plenum Publishing Corp. New York 1990: pp 40-41

SUMMARY OF THE INVENTION

Various methods for preventing a specimen from being charged have been hitherto known. For example, there is a method of depositing an electric conductor such as metal on a specimen when observing the specimen. A coating device and the like are provided for practical use in order to perform this method. This method for analyzing a specimen, however, may be a destructive inspection and it cannot be adopted to a product inspection in a semiconductor industry.

In the method disclosed in Japanese Patent Application Laid-Open (JP-A) No. 2005-142038, the scanning order in the scanning area is changed. This method is on the assumption that the electric charges accumulated in the respective scans are diffused at the same time constant as the scanning periodic cycle. This method, however, is defective in efficacy when the diffusion constant of the electric charges becomes some hundreds times longer than the scanning cycle. This happens, for example, when observing a liquid crystal optical element and a photomask.

In the method disclosed in the "Charge Control During Photomask Critical Dimension (CD) Metrology" written by David Joy, International SEMATEC Technology Transfer #3114452B-ENG (2004), the periphery of a specimen is surrounded by inert gas molecules at the time of electron beam irradiation. This method makes use of such an action that the inert gas ions ionized by the electron beam neutralize the accumulated electric charges of the specimen. In this method, the accumulated electric charges themselves can be removed. In this method, however, the detection efficiency of the secondary electrons much depends on the pressure of the inert gas around the specimen. Therefore in order to obtain a stable image, a fine control on the pressure of the gas is necessary, which is a big problem in installation.

An object of the invention is to prevent from an image drift caused by an electrically charged specimen when observing the specimen including an insulating material, in a charged particle beam system.

SUMMARY OF THE INVENTION

According to the invention, the charged particle beam irradiation system has a deflector for deflecting a particle beam, an objective lens for converging the irradiating particle beam on the specimen, and a secondary electron signal detector for detecting a secondary electron signal released from the specimen, hence to create an image according to the signal from the secondary electron signal detector.

According to the invention, a first scan is performed in a predetermined scanning direction on scanning line and a predetermined sequential direction of scanning lines and a second scan is performed in a scanning direction different from the predetermined scanning direction and a sequential direction different from the predetermined sequential direction.

An image may be created by repeating the process of executing the second scan after executing the first scan and by requiring the arithmetic average of the frames obtained by the second scans. An image may be created by averaging arithmetically at least one frame obtained by the first scan and at least one frame obtained by the second scan.

According to the invention, it is possible to prevent from an image drift caused by charge of a specimen when observing the specimen including an insulating material.

DESCRIPTION OF REFERENCE NUMERALS

101: specimen
103: target area
103a, 103b, 103c: frame (inverse)
104: scanning direction (inverse) on scanning line
105a, 105b: scanning direction (normal) on scanning line
106a, 106b, 106c: frame (normal)
107: sequential direction (inverse) of scanning lines
108: sequential direction (normal)
109: scanning area
110: asymmetry (inverse) in electric charge distribution
111: asymmetry (normal) in electric charge distribution

DETAILED DESCRIPTION OF THE PREFERRED EMBODIMENT

Figure 1:
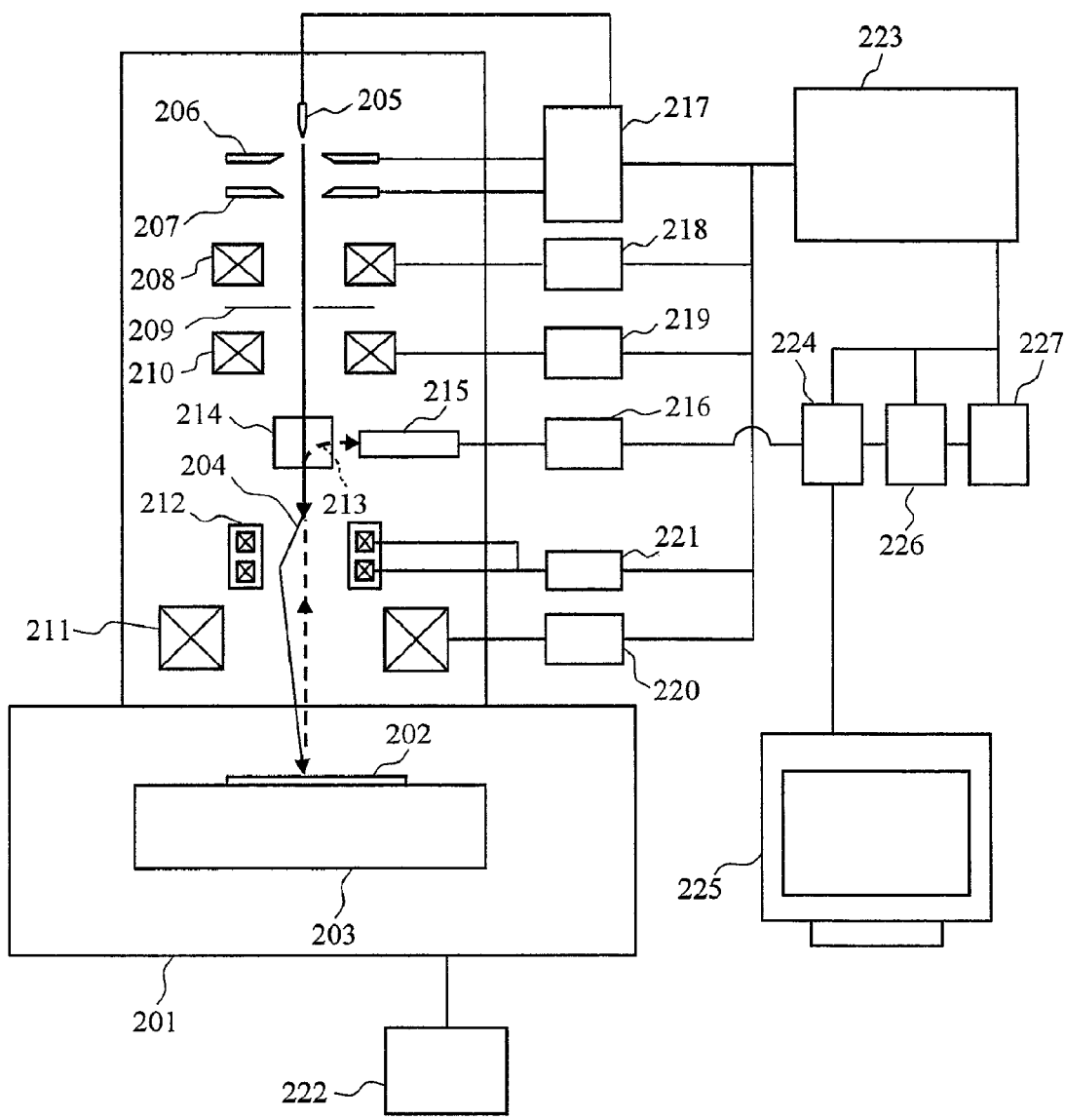
FIG. 1 is a view showing a constitutional example of a charged particle beam irradiation system according to the invention.

With reference to FIG. 1, an example of a charged particle beam irradiation system according to the invention will be described. In this example, the charged particle beam irradiation system is a scanning electron microscope. The scanning electron microscope in the example has an electron source cathode 205, a first anode 206, a second anode 207, a first converging lens 208, an aperture plate 209, a second converging lens 210, an orthogonal field generator 214, a scanning coil 212, an objective lens 211 and a specimen support 203. The specimen support 203 is arranged in a specimen chamber 201. The specimen chamber 201 is kept in a high vacuum state of about $1 \times 10^{-4}$ Pa by a vacuum exhaust system 222.

The scanning electron microscope further has power sources 217, 218, 219, and 220 for supplying voltage to be applied to the electron source cathode 205, the first anode 206, the second anode 207, the first converging lens 208, the second converging lens 210, and the objective lens 211. The scanning electron microscope further has a scanning signal power source 221 for supplying saw-tooth current to the scanning coil 212.

The scanning electron microscope has a secondary electron signal detector 215, a signal amplifier 216, a controller 223, a drawing device 224, an image display device 225, an image storing device 226, and an image processor 227.

A method of obtaining an image of a specimen by the scanning electron microscope will be described in brief. First, a specimen 202 is arranged on the specimen support 203 in the specimen chamber 201. The electron beam 204 discharged from the electron source cathode 205 is accelerated by the first anode 206 and the second anode 207, converged by the first converging lens 208, passing through the aperture plate 209, converged by the second converging lens 210, and deflected by the scanning coil 212. The electron beam 204 is further converged by the objective lens 211, into a convergent beam having a minute cross sectional diameter, and arrives at the surface of the specimen 202.

Although the scanning mechanism of the example uses a magnetic field method using a magnetic field generated by the scanning coil, it can also use an electric field method using an electric field generated by applying voltage to the opposite electrodes. The secondary electron signal (in this case, the secondary electron) 213 generated from the specimen 202 is drawn by the voltage applied between the specimen 202 and the objective lens 211 and proceeds beyond the objective lens 211. The secondary electron signal 213 is separated from the primary electron beam 204 by the orthogonal field generator 214 and arrives at the secondary electron signal detector 215. The secondary electron signal 213 is converted into electric signal by the secondary electron signal detector 215, amplified by the signal amplifier 216, and sent to the drawing device 224. The drawing device 224 converts the secondary electron signal 213 into image signal and transfers it to the image display device 225. Thus, the specimen image is displayed by the image display device 225. The image signal is further transferred to the image storing device 226. The image processor 227 performs the averaging processing, detection of a specific shape, detection of an image shift, and measurement of a specific shape dimension on the image information taken in by the image storing device 226. Namely, the image processor 227 performs the image processing described with reference to FIG. 2 to FIG. 5. All these elements are sequentially controlled by the controller 223.

Figure 2:
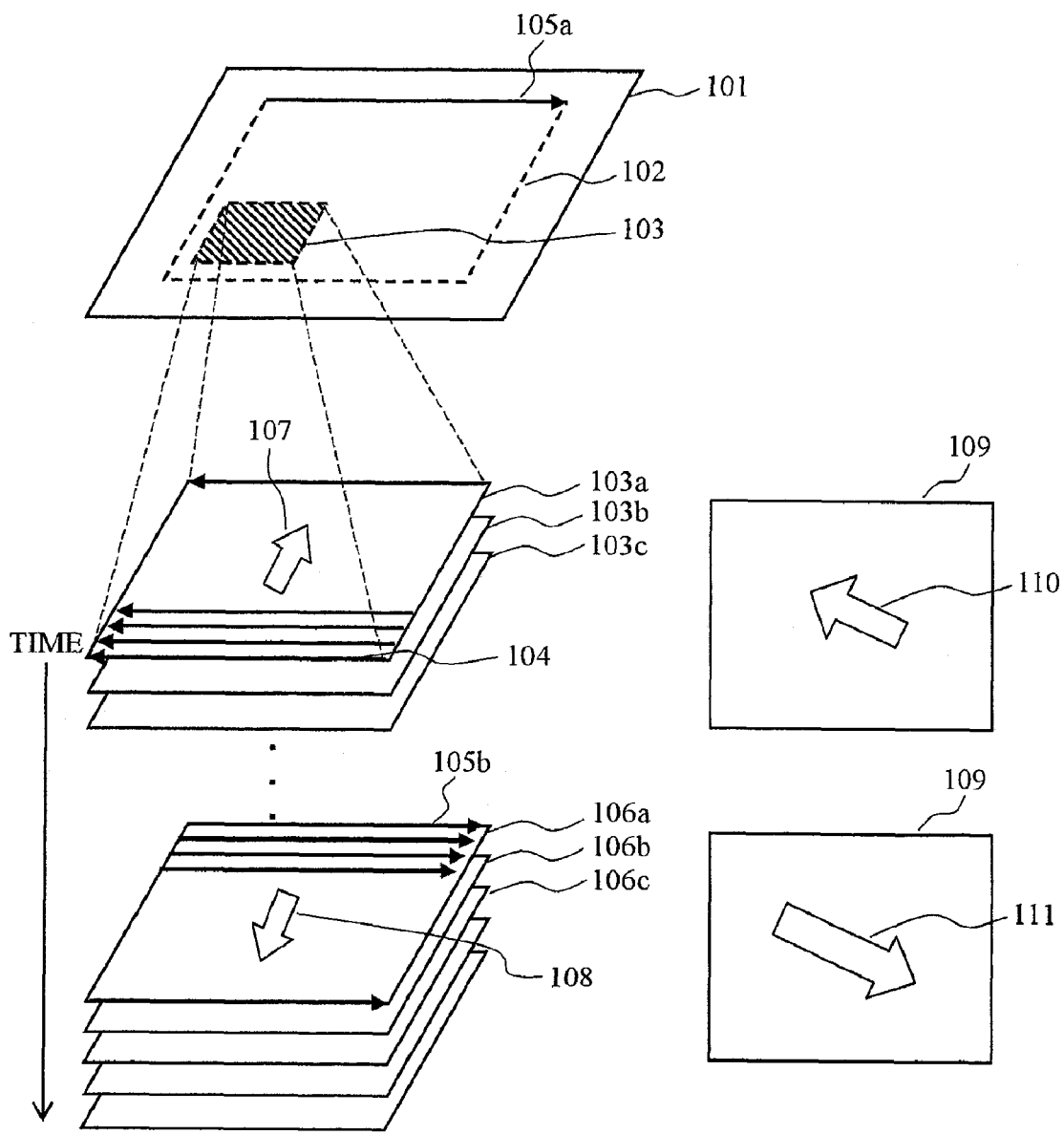
FIG. 2 is a view for use in describing a first example of a method for creating an image according to a scanning electron microscope of the invention.

A first example of a method for creating an image according to a scanning electron microscope of the invention will be described with reference to FIG. 2. When observing a target area 103 on a specimen 101, generally, a "view search" for searching the target area 103 is first performed. In the view search, a relatively wide area 102 including the target area 103 is observed at a comparatively low magnification. Namely, scan is performed in the normal scanning direction 105a, to obtain an image of the wide area 102. At this time, the positive electric charges produced by the discharge of the secondary electrons are accumulated in the wide area 102. After the target area 103 is found in the wide area 102, the target area 103 is observed at a comparatively high magnification.

In the conventional technique, when observing the target area 103, a scan is performed in a scanning direction 105b, and the resultant frames 106a, 106b, and 106c are arithmetically averaged, hence to get an image of the target area 103. At this time, since the scanning direction 105b on scanning line and the sequential direction 108 of scanning lines are always constant, there occurs asymmetry 111 in the distribution of the electric charges varying periodically, in the scanning area 109 for observing the target area 103. The asymmetry 111 in the distribution of the electric charges creates an asymmetric electric field above the scanning area 109 and deflects the incident electron beam. This is one of the reasons for causing an image drift.

According to the invention, when observing the target area 103, a preliminary scan is first performed and then a main scan is performed. At first, a first preliminary scan is performed. The preliminary scan and the main scan may be performed in the same number of times.

The preliminary scan is performed in an inverse scanning direction 104 to the scanning direction 105b of the main scan and in an inverse sequential direction 107 to the sequential direction 108 of the main scan. According to this, a first preliminary frame 103a is obtained. Next, a first main scan is performed. The main scan is performed in the same way as the conventional technique; in the normal scanning direction 105b on scanning line and in the normal sequential direction 108 of scanning lines. Thus, a first main frame 106a can be obtained. Next, a second preliminary scan is performed to get a second preliminary frame 103b. A second main scan is performed to get a second main frame 106b. Similarly, a third preliminary scan is performed to get a third preliminary frame 103c. A third main scan is performed to get a third main frame 106c. Thus obtained main frames 106a, 106b, and 106c are averaged arithmetically, hence to obtain an image.

The preliminary scan produces an asymmetry 110 in the distribution of electric charges periodically changing, in the scanning area 109. The main scan after the preliminary scan produces an asymmetry 111 in the distribution of electric charges periodically changing, in the scanning area 109. However, the direction of the asymmetry 110 in the distribution of electric charges caused by the preliminary scan is opposite to the direction of the asymmetry 111 in the distribution of electric charges caused by the main scan. Therefore, two asymmetries 110 and 111 are cancelled out each other.

When the frames 106a, 106b, and 106c obtained by the main scan performed after the preliminary scan are averaged arithmetically, since the two asymmetries 110 and 111 are cancelled out, there occurs no image drift. According to this, it is possible to eliminate an image drift caused by the charge of the specimen. The direction of the asymmetries 110 and 111 in the distribution of electric charges means the direction of the electric field vector.

When the specimen is an insulator, the attenuation constant of the accumulated electric charges is the same order as the frame formation time. Therefore by overlapping the scans of the opposite directions, the asymmetries of the accumulated electric charges can be cancelled out. The scanning direction can be changed just by reversing the polarity of the saw-tooth current applied to the scanning coil 212 in FIG. 1. Namely, it is possible just by a change in the control procedure installed in the controller 223 without adding anything to the original structure of SEM shown in FIG. 1. The invention is to provide a device for cutting down the image drift occurring at the time of observing an insulator, at a very low cost.

A second example of the method for creating an image according to the scanning electron microscope of the invention will be described with reference to FIG. 3. A first scan is performed in the inverse scanning direction 302 and in the inverse sequential direction 308, to obtain a first group of frames 301a and 301b. Next, a second scan is performed in the normal scanning direction 304 and in the normal sequential direction 309, to obtain a second group of frames 303a, 303b, and 303c. A third scan is performed in the inverse scanning direction 302 and in the inverse sequential direction 308, to obtain a third group of frames 301c and 301d. A fourth scan is performed in the normal scanning direction 304 and in the normal sequential direction 309, to obtain a fourth group of frames 303d, 303e, and 303f.

In this example, all the frames 301a, 301b, 303a, 303b, 303c, 301c, 301d, 303d, 303e, and 303f are arithmetically averaged, hence to obtain an image. The scan in the normal scanning direction 304 and in the normal sequential direction 309 may be performed the same number of times as the scan in the inverse scanning direction 302 and in the inverse sequential direction 308.

The asymmetry 306 in the distribution of the electric charges produced in the scanning area 305 by the first and third scans is opposite in direction to the asymmetry 307 in the distribution of the electric charges produced in the scanning area 305 by the second and fourth scans. Accordingly, the asymmetry 306 in the distribution of the electric charges produced by the first and the third scans is cancelled out by the asymmetry 307 in the distribution of the electric charges produced by the second and the fourth scans. Therefore, any image drift does not occur.

Figure 3:
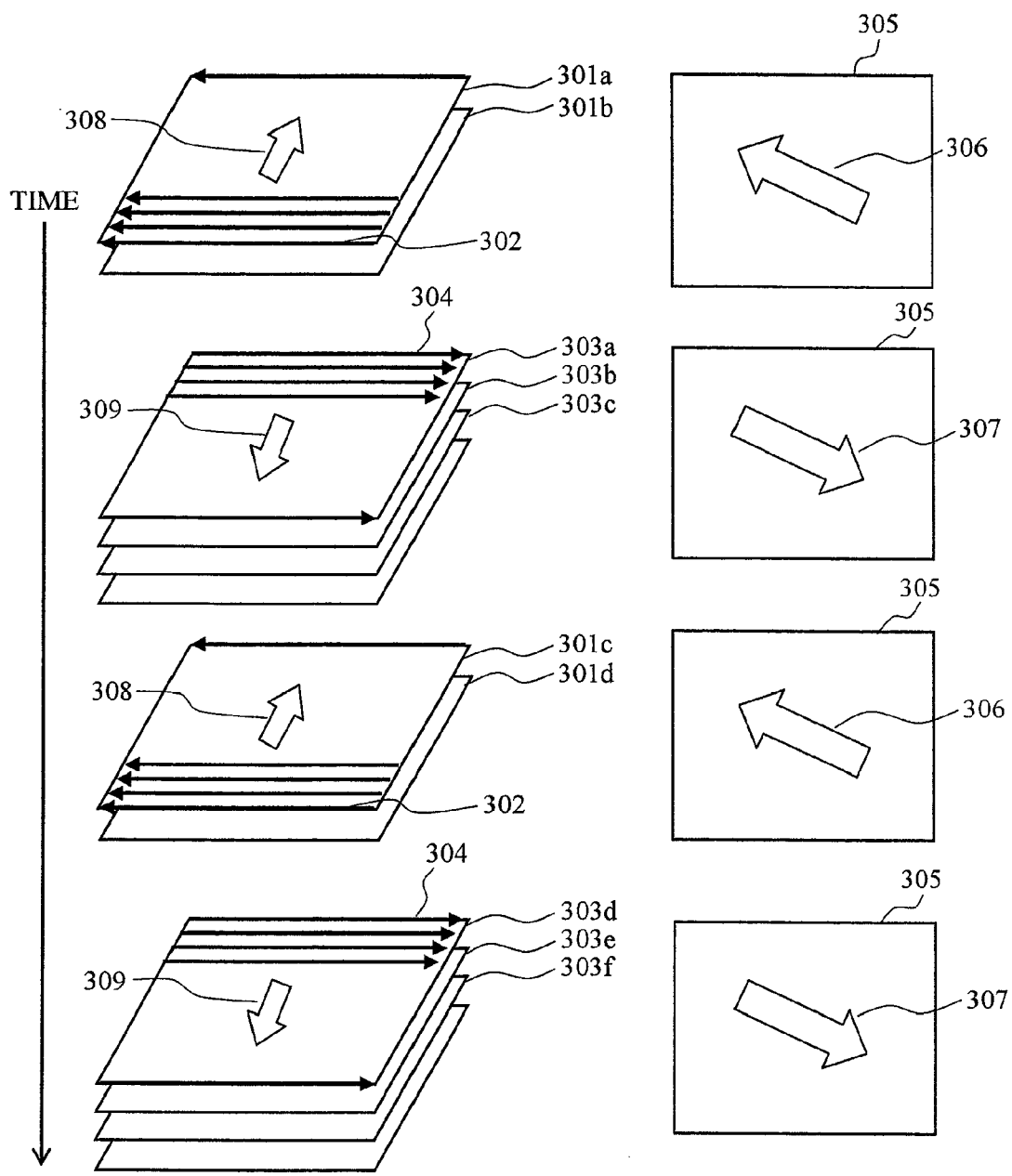
FIG. 3 is a view for use in describing a second example of the method for creating an image according to the scanning electron microscope of the invention.

The example of FIG. 3 is effective especially in the path where the accumulated electric charges on the specimen are diffused, for example, when there exists a film of conductive material with high resistance and the like and the attenuation constant of the accumulated electric charges is small. Also in the example, the intervals of inserting the inverse frames and the number of the frames may be set previously in the controller 223 of FIG. 1, which can be realized just by changing the control procedure.

Figure 4:
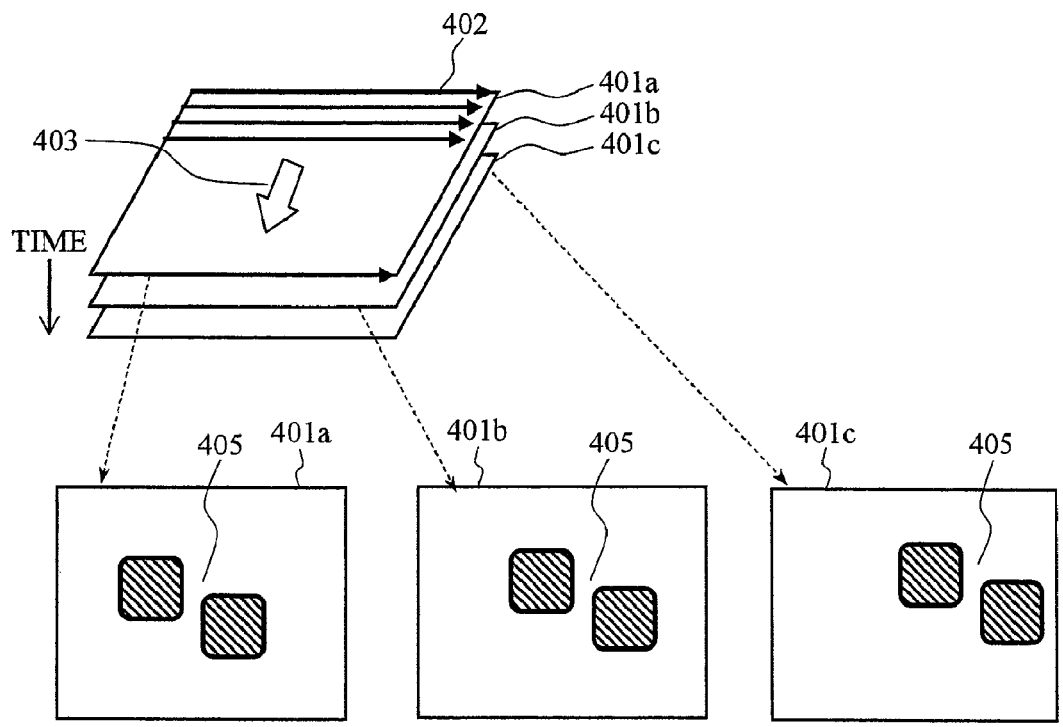
FIG. 4 is a view for use in describing a third example of the method for creating an image according to the scanning electron microscope of the invention.

A third example of a method for creating an image according to the scanning electron microscope of the invention will be described with reference to FIG. 4. In the example, a plurality of scans are performed in the normal scanning direction 402 and in the normal sequential direction 403, to obtain frames 401a, 401b, and 401c. The scans are performed at predetermined intervals of time. Therefore, the positions of the image element 405 included in the respective frames 401a, 401b, and 401c are shifted. Therefore a shift amount between the images included in the frames 401a, 401b, and 401c is detected. This is the image drift amount. The method for detecting the shift amount between the images is known. For example, refer to John C. Russ: Computer-Assisted Microscopy; Plenum Publishing Corp. New York 1990: pp 45-46. When the image drift amount exceeds a predetermined value, a method shown in FIG. 2 and FIG. 3 is executed.

Figure 5:
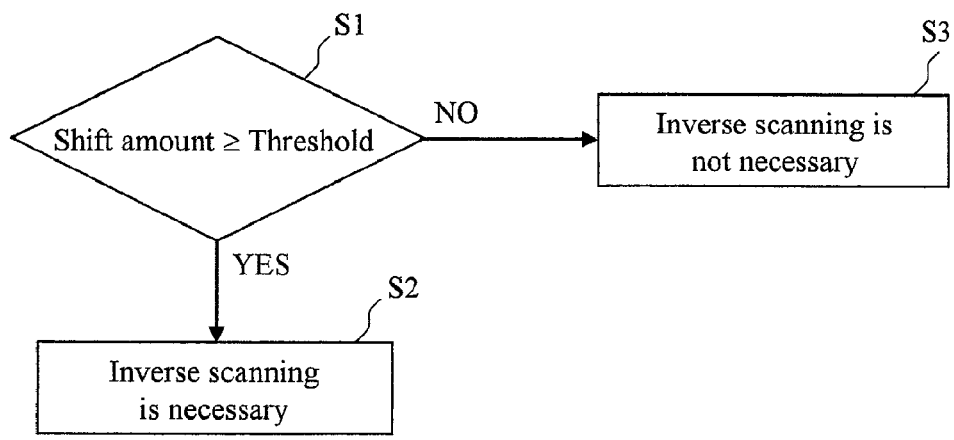
FIG. 5 is a view for use in describing the flow of the processing in the third example of the method for creating an image according to the scanning electron microscope of the invention.

FIG. 5 is an example of algorithm for executing the third example of the method for creating an image according to the scanning electron microscope of the invention. At first in Step S1, it is checked whether the image drift amount, in other words, the shift amount of the images is equal to or more than a predetermined threshold. When the shift amount of the images is equal to or more than a predetermined threshold, the processing proceeds to Step S2, where the scan in the inverse scanning direction on scanning line and in the inverse sequential direction of scanning lines is performed, as shown in FIG. 2 and FIG. 3. When the shift amount of the images is less than the predetermined threshold, the processing proceeds to Step S3, where the image creating processing is performed without inversing the scanning direction and the sequential direction.

When the image magnification is, for example, one hundred thousand times, the image shift amount is about one nanometer/second in the threshold used in Step S1.

In the example, the scan is performed inverting both the scanning direction and sequential direction at 180 degree. However, either the scanning direction or the sequential direction may be inverted. For example, when the image drift has a circular motion on the screen, inversion only in the scanning direction is effective. The conversion angle may be any angle other than 180 degree. Further, a plurality of frames at different angles can be sequentially inserted and a method most suitable to a specimen can be searched for.

As set forth hereinabove, although the example of the invention has been described, the invention is not restricted to the examples but it is easily understood for those who skilled in the art that various modifications can be made within the scope of the invention disclosed in the appended claims.

Although in the example, the scanning electron microscope has been mainly used as an example, the invention can be applied to an irradiation device using charged particles other than the electron beam, for example, using kalium ion. Since it can be widely applied to an analysis for an insulator, it can be applied especially to an observation and an inspection device of a liquid crystal optical element, a surface acoustic wave device, and a photomask for semiconductor industry.

What is claimed is:

1. A charged particle beam irradiation system having a deflector for deflecting a particle beam, an objective lens for converging an irradiating particle beam on a specimen, and a secondary electron signal detector for detecting a secondary electron signal released from the specimen, to create an image according to the signal from the secondary electron signal detector, wherein
a scan by the deflector using the particle beam includes a first scan in a predetermined scanning direction on scanning line and in a predetermined sequential direction of scanning lines and a second scan in a scanning direction different from the predetermined scanning direction and in a sequential direction different from the predetermined sequential direction.

2. The charged particle beam irradiation system according to claim 1, wherein
a process of executing the second scan after executing the first scan is repeated and frames obtained by the second scans are arithmetically averaged, hence to create an image.

3. The charged particle beam irradiation system according to claim 1, wherein
at least one frame obtained by the first scan and at least one frame obtained by the second scan are arithmetically averaged, hence to create an image.

4. The charged particle beam irradiation system according to claim 1, wherein
the scanning direction on scanning line and the sequential direction of scanning lines in the second scan are opposite to the scanning direction on scanning line and the sequential direction of scanning lines in the first scan respectively.

5. The charged particle beam irradiation system according to claim 1, wherein
the first scan and the second scan are respectively performed the same number of times.

6. The charged particle beam irradiation system according to claim 1, wherein
when an image drift is less than a predetermined threshold, only the first scan is performed and when the image drift exceeds the predetermined threshold, the first scan and the second scan are performed.

7. An electron beam scanning image creating method comprising:
deflecting an electron beam on a specimen,
converging an irradiating electron beam on the specimen,
detecting a secondary electron signal released from the specimen, and
creating an image from the secondary electron signal, wherein
the deflecting scan includes a first scan in a predetermined scanning direction on scanning line and in a predetermined sequential direction of scanning lines and a second scan in an inverse scanning direction to the predetermined scanning direction and in an inverse sequential direction to the predetermined sequential direction.

8. The electron beam scanning image creating method according to claim 7, wherein
a process of executing the second scan after executing the first scan is repeated and frames obtained by the second scans are arithmetically averaged, hence to create an image.

9. The electron beam scanning image creating method according to claim 7, wherein
at least one frame obtained by the first scan and at least one frame obtained by the second scan are arithmetically averaged, hence to create an image.

10. The electron beam scanning image creating method according to claim 7, wherein
the first scan and the second scan are respectively performed the same number of times.

11. The electron beam scanning image creating method according to claim 7, wherein
when an image drift is less than a predetermined threshold, only the first scan is performed and when the image drift exceeds the predetermined threshold, the first scan and the second scan are performed.

12. A scanning electron microscope having a deflector for deflecting an electron beam, an objective lens for converging an irradiating electron beam on a specimen, a secondary electron signal detector for detecting a secondary electron signal released from the specimen, and an image processor for processing an image signal created according to the signal from the secondary electron signal detector, wherein
a scan by the deflector using the electron beam includes a first scan in a predetermined scanning direction on scanning line and in a predetermined sequential direction of scanning lines and a second scan in an inverse scanning direction to the predetermined scanning direction and in an inverse sequential direction to the predetermined sequential direction.

13. The scanning electron microscope according to claim 12, wherein
executing the second scan after executing the first scan is repeated and frames obtained by the second scans are arithmetically averaged, hence to create an image.

14. The scanning electron microscope according to claim 12, wherein
at least one frame obtained by the first scan and at least one frame obtained by the second scan are arithmetically averaged, hence to create an image.

15. The scanning electron microscope according to claim 12, wherein
when an image drift is less than a predetermined threshold, only the first scan is performed and when the image drift exceeds the predetermined threshold, the first scan and the second scan are performed.

* * * * *